US 6,735,490 B2

(12) United States Patent
Anand et al.

(10) Patent No.: US 6,735,490 B2
(45) Date of Patent: May 11, 2004

(54) METHOD AND SYSTEM FOR AUTOMATED INTEGRATION OF DESIGN ANALYSIS SUBPROCESSES

(75) Inventors: Ashok Kumar Anand, Schenectady, NY (US); Brian Jacob Berry, Troy, NY (US); Johnny Yit Boey, Clifton Park, NY (US); Michael Jandrisevits, Clifton Park, NY (US); Patrick King Wah May, Schenectady, NY (US); Gregory Paul Wotzak, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 426 days.

(21) Appl. No.: 09/682,750

(22) Filed: Oct. 12, 2001

(65) Prior Publication Data

US 2003/0074163 A1 Apr. 17, 2003

(51) Int. Cl.⁷ .............................................. G06F 19/00
(52) U.S. Cl. ........................... 700/97; 700/28; 700/287
(58) Field of Search ............................ 700/28, 36, 97, 700/275, 287; 705/1

(56) References Cited

U.S. PATENT DOCUMENTS

| 4,442,665 | A |   | 4/1984 | Fick et al. ................. 60/39.12 |
| 4,785,622 | A |   | 11/1988 | Plumley et al. ............ 60/39.12 |
| 5,081,591 | A |   | 1/1992 | Hanway et al. ............. 323/205 |
| 5,347,466 | A |   | 9/1994 | Nichols et al. ................ 703/18 |
| 5,666,297 | A |   | 9/1997 | Britt et al. ..................... 703/18 |
| 5,886,895 | A |   | 3/1999 | Kita et al. ..................... 700/28 |
| 5,946,661 | A | * | 8/1999 | Rothschild et al. ............. 705/7 |
| 6,169,927 | B1 | * | 1/2001 | Schonthal et al. ............. 700/1 |
| 6,230,495 | B1 |   | 5/2001 | Benesch et al. ............. 60/660 |
| 6,397,117 | B1 | * | 5/2002 | Burrows et al. ............. 700/97 |
| 2002/0029218 | A1 | * | 3/2002 | Bentley et al. ............. 707/100 |
| 2002/0062339 | A1 | * | 5/2002 | Carter et al. ................ 709/203 |
| 2003/0109948 | A1 | * | 6/2003 | Phelps et al. ................. 700/97 |

* cited by examiner

Primary Examiner—Ramesh Patel
Assistant Examiner—Ronald D Hartman, Jr.
(74) Attorney, Agent, or Firm—Hunton & Williams LLP

(57) ABSTRACT

A system and method for analyzing a design using predetermined analysis models are presented. The method may be carried out on an automated design system including an integration server in communication with a plurality of subprocess servers each configured for conducting a subprocess analysis using one of the analysis models. The method comprises receiving at the integration server an analysis request including a set of desired performance parameters and constructing a set of design characteristics for meeting the desired performance parameters. The method further includes determining a set of design performance results associated with the set of design characteristics using the analysis models of the subprocess servers. The step of determining may include passing input information from the integration server to the plurality of subprocess servers, at least a portion of the input information being respectively processed to a format usable in the analysis model of each of the plurality of subprocess servers, passing output information from each of the plurality of subprocess servers to the integration server and using the output information to determine the design performance results.

8 Claims, 7 Drawing Sheets

METHOD AND SYSTEM FOR AUTOMATED INTEGRATION OF DESIGN ANALYSIS SUBPROCESSES

BACKGROUND OF THE INVENTION

This invention relates to automated design systems and more particularly to a design integration system that integrates existing subprocess models into a single automated design process.

A complex engineering design analysis may require that multiple interdependent analysis subprocesses be integrated into a single overall process. The analysis subprocesses are typically interdependent in that a first subprocess may require inputs from a second subprocess, which will, in turn, be impacted by the output of the first subprocess. Complex design processes may involve a large number of subprocesses that have interdependent parameters but otherwise involve disparate analyses. For example, an integrated gasification combined cycle (IGCC) power plant design analysis requires the integration of a number of engineering and economic analysis processes. These analytical processes consist of the evaluation models for the performance of its various physical units and models for costing, operation and maintenance and plant economics.

Unfortunately, the various analytical models for complex processes such as the design of an IGCC power plant may reside on separate processing platforms or may be owned by distinct entities with differing interests. This complicates and slows the design process and typically requires human intervention.

SUMMARY OF THE INVENTION

The present invention provides a system and method for analyzing a design using predetermined analysis models. The method may be carried out on an automated design system including an integration server in communication with a plurality of subprocess servers. Each subprocess server may be configured for conducting a subprocess analysis using one of the analysis models. The method comprises receiving at the integration server an analysis request including a set of desired performance parameters and constructing a set of design characteristics for meeting the desired performance parameters. The method further includes determining a set of design performance results associated with the set of design characteristics using the analysis models of the subprocess servers. The step of determining may comprise passing input information from the integration server to the plurality of subprocess servers and processing at least a portion of the input information to a format usable in the analysis model of each of the plurality of subprocess servers. The step of determining may further comprise passing output information from each of the plurality of subprocess servers to the integration server and using the output information to determine the design performance results.

The step of determining a set of design performance results in a method of the invention may include converting the output information to a predetermined format. The method may further comprise comparing the set of design performance results to the set of desired performance parameters to determine if the design performance results are within a range of acceptability. Responsive to a determination that the design performance results are not within the range of acceptability, the method may include adjusting the set of design characteristics and repeating the steps of determining a set of design performance results and comparing the set of design performance results.

In methods of analyzing a design according to the present invention, at least a portion of the output information from a first one of the plurality subprocess servers may be included in the input information passed to a second one of the plurality of subprocess servers.

Another aspect of the invention provides a method of analyzing a design using predetermined analysis models. The method is carried out using an automated design system that includes an integration server in communication with at least one subprocess server configured for conducting a subprocess analysis using one of the analysis models. The method comprises receiving at the integration server an analysis request including a set of desired performance parameters and constructing a set of design characteristics for meeting the desired performance parameters. The method further comprises constructing a first set of analysis input information comprising input data required by a first one of the at least one subprocess server to conduct an analysis using a first analysis model. The input data is determined using the design characteristics. The method still further comprises communicating the first analysis input information to the first subprocess server and processing the input data to a format usable by the first subprocess server. First subprocess analysis output data is generated using the first analysis model and the input data and a first set of analysis output information is formed. The first set of analysis output information includes the first subprocess analysis output data. The formation of the first set of analysis output information may include conversion of the first subprocess analysis output data to a predetermined format. The method also comprises transferring the first set of analysis output information to the integration server; and determining a set of design performance results using at least a portion of the first set of analysis output information.

The step of processing the first analysis input information may include the step of converting the first analysis input information to the usable format, responsive to a determination that the first analysis input information as communicated by the integration module is not in a usable format.

The above method of analyzing a design according to the invention may comprise the steps of comparing the set of design performance results to the set of desired performance parameters to determine if the design performance results are within a range of acceptability and responsive to a determination that the design performance results are not within the range of acceptability, adjusting the set of design characteristics and repeating the steps of communicating, processing, generating, forming, transferring and determining.

The automated design system of a method of the invention may include a plurality of subprocess servers each configured for conducting a subprocess analysis using one of the analysis models. The step of determining a set of design performance results using at least a portion of the first set of analysis output information may include creating a second set of analysis input information including at least a portion of the subprocess analysis output data. The second set of analysis input information may comprise second analysis input data required by a second one of the plurality of subprocess servers to conduct an analysis using a second analysis model. The method may further comprise transmitting the second set of analysis input information to the second subprocess server and processing the second analysis input data to a format usable by the second subprocess server. The method may still further comprise generating second subprocess analysis output data using the second analysis model and the second analysis input data. A second set of analysis output information including the second subprocess analysis output data may be formed. The formation of the second set of analysis output information may include converting the second subprocess analysis output data to a predetermined format. The method may also comprise transferring the second set of analysis output information to the integration server and determining the set of design performance results using at least a portion of the second set of analysis output information.

The step of processing the second analysis input information may include the step of converting the second analysis input information to the usable format, responsive to a determination that the second analysis input information as communicated by the integration module is not in a usable format.

Yet another aspect of the invention provides an automated design integration system for integrating a plurality of analysis subprocesses into a single process for determining a design solution meeting a set of design criteria. The system comprises an integration server and a process analysis module. The process analysis module is adapted for processing output information from at least one subprocess server, the output information being used to determine the design solution. The process analysis module is also adapted for generating input information for the at least one subprocess server. The system further comprises at least one subprocess server in selective communication with the integration server. A subprocess analysis module is included in each of the at least one subprocess server. The subprocess analysis module is adapted for receiving input data in a predetermined input format. The subprocess analysis module is also adapted for conducting an analysis subprocess and for providing output data in a predetermined output format. The system also comprises a conversion module in each of the at least one subprocess server. The conversion module is adapted for receiving input information from the integration server, for converting the input information to the predetermined input format, and for submitting the input information to the subprocess analysis module.

The conversion module of a design integration system of the invention may be further configures for receiving the output data from the subprocess analysis module and converting the output data to output information in a format usable by the process analysis module.

The integration server and the at least one subprocess server of a design integration system of the invention may be selectively connected through a network.

In an illustrative design integration system of the invention, the design solution includes a set of IGCC power plant design characteristics. In this system, the automated design integration system comprises a plurality of subprocess servers including, for example, one or more of a gas turbine subprocess server, a gasification subprocess server, a feed stock preparation subprocess server, an operation and maintenance cost subprocess server, an equipment and installation cost subprocess server and a plant economics subprocess server.

The invention also provides an automated IGCC power plant design integration system for determining an IGCC power plant design solution meeting a set of predetermined but variable design criteria. The system comprises a gas turbine subprocess server having a gas turbine subprocess analysis module and a gas turbine data conversion module. The gas turbine data conversion module is adapted for receiving gas turbine input information from the integration server, converting the gas turbine input information to a predetermined gas turbine data input format and submitting the gas turbine input information to the gas turbine subprocess analysis module. The system further comprises a gasification subprocess server having a gasification subprocess analysis module and a gasification data conversion module. The gasification data conversion module is adapted for receiving gasification input information from the integration server, converting the gasification input information to a predetermined gasification data input format and submitting the gasification input information to the gasification subprocess analysis module. The system still further comprises a feed stock preparation subprocess server having a feed stock preparation subprocess analysis module and a feed stock preparation data conversion module. The feed stock preparation data conversion module is adapted for receiving feed stock preparation input information from the integration server, converting the feed stock preparation input information to a predetermined feed stock preparation data input format and submitting the feed stock preparation input information to the feed stock preparation subprocess analysis module. The system may also comprise a plant cost subprocess server having at least one cost subprocess analysis module and at least one cost data conversion module. The at least one cost data conversion module is adapted for receiving cost input information from the integration server, converting the cost input information to a predetermined cost data input format and submitting the cost input information to the cost subprocess analysis module. One or more of the gas turbine, gasification, feed stock preparation and plant cost subprocess servers are in selective communication with an integration server. The integration server has a process analysis module adapted for processing output information received from and generating input information for delivery to the gas turbine, gasification, feed stock preparation and plant cost subprocess servers. The process analysis module is adapted to determine the IGCC power plant design solution based at least in part on the output information. The integration server and at least one of the gas turbine, gasification, feed stock preparation and plant cost subprocess servers may be selectively connected through a network.

Yet another aspect of the invention provides an automated IGCC power plant design integration system for determining an IGCC power plant design solution meeting a set of predetermined but variable design criteria. The system comprises a gas turbine subprocess server having a gas turbine subprocess analysis module, and a gas turbine data conversion module in communication with the gas turbine subprocess server. The gas turbine subprocess analysis module is adapted for receiving gas turbine input information from the integration server, converting the gas turbine input information to a predetermined gas turbine data input format and submitting the gas turbine input information to the gas turbine subprocess analysis module. The system also comprises a gasification subprocess server having a gasification subprocess analysis module, and a gasification data conversion module in communication with the gasification subprocess server. The gasification data conversion module is adapted for receiving gasification input information from the integration server, converting the gasification input information to a predetermined gasification data input format and submitting the gasification input information to the gasification subprocess analysis module. The system further comprises a feed stock preparation subprocess server having a feed stock preparation subprocess analysis module, and a feed stock preparation data conversion module in communication with the feed stock preparation subprocess server. The feed stock preparation data conversion module is adapted for receiving feed stock preparation input information from the integration server, converting the feed stock preparation input information to a predetermined feed stock preparation data input format and submitting the feed stock preparation input information to the feed stock preparation subprocess analysis module. The system still further comprises a plant cost subprocess server having at least one cost subprocess analysis module, and at least one cost data conversion module in communication with the plant cost subprocess server. The at least one cost data conversion module is adapted for receiving cost input information from the integration server, converting the cost input information to a predetermined cost data input format and submitting the cost input information to the cost subprocess analysis module. The system also includes an integration server in selective communication with one or more of the gas turbine, gasification, feed stock preparation and cost data conversion modules. The integration server has a process analysis module adapted for processing output information received from and generating input information for delivery to the gas turbine, gasification, feed stock preparation and plant cost subprocess servers. The process analysis module is adapted to determine the IGCC power plant design solution based at least in part on the output information.

Still another aspect of the invention provides an automated IGCC power plant design integration system for determining an IGCC power plant design solution meeting a set of predetermined but variable design criteria. The system comprises a gas turbine subprocess server having a gas turbine subprocess analysis module, a gasification subprocess server having a gasification subprocess analysis module, a feed stock preparation subprocess server having a feed stock preparation subprocess analysis module, and a plant cost subprocess server having at least one cost subprocess analysis module. The system also comprises an integration server in selective communication with the gas turbine, gasification, feed stock preparation and plant cost subprocess servers. The system further comprises a process analysis module included in the integration server, the process analysis module being adapted for processing output information received from and generating input information for delivery to the gas turbine, gasification, feed stock preparation and plant cost subprocess servers. The process analysis module is also adapted to determine the IGCC power plant design solution based at least in part on the output information. The system still further comprises a data conversion module in communication with the integration server. The data conversion module is adapted for receiving gas turbine input information from the integration server, converting the gas turbine input information to a predetermined gas turbine data input format and submitting the gas turbine input information to the gas turbine subprocess analysis module. The data conversion module is also adapted for receiving gasification input information from the integration server, converting the gasification input information to a predetermined gasification data input format and submitting the gasification input information to the gasification subprocess analysis module. The data conversion module is also adapted for receiving feed stock preparation input information from the integration server, converting the feed stock preparation input information to a predetermined feed stock preparation data input format and submitting the feed stock preparation input information to the feed stock preparation subprocess analysis module. The data conversion module is also adapted for receiving cost input information from the integration server, converting the cost input information to a predetermined cost data input format and submitting the cost input information to the cost subprocess analysis module. The integration server, the data conversion module and the gas turbine, gasification, feed stock preparation and plant cost data conversion modules may be selectively connected through a network.

The data conversion module of the above-described system may be a part of the integration server. Alternatively, the data conversion module may be a part of one of the gas turbine, gasification, feed stock preparation and plant cost subprocess servers.

Other objects and advantages of the invention will be apparent to one of ordinary skill in the art upon reviewing the detailed description of the invention.

DETAILED DESCRIPTION OF THE INVENTION

As noted above, a complex design analysis generally requires a large number of subprocess analyses. Because the various subprocess analyses are often conducted by separate entities within an organization or by separate organizations or companies, the models used to conduct the subprocess analyses may not be directly compatible. Moreover, the models themselves may involve the use of proprietary code or data. As a result, the overall design process may be slowed by the necessity of obtaining output data from one subprocess and virtually hand-delivering the data to the owner of a second subprocess, who receives the data, manipulates it if necessary to make it compatible with his analysis model, conducts an analysis and provides the output to the requestor. This output may or may not be in a form that is directly usable by the requestor in the overall process. The data are then used as inputs to another subprocess, which may involve yet another separate subprocess owner. When multiple subprocesses with multiple owners are involved and multiple iterations through the subprocesses are required, the overall process is clumsy, expensive and time-consuming.

Figure 1:
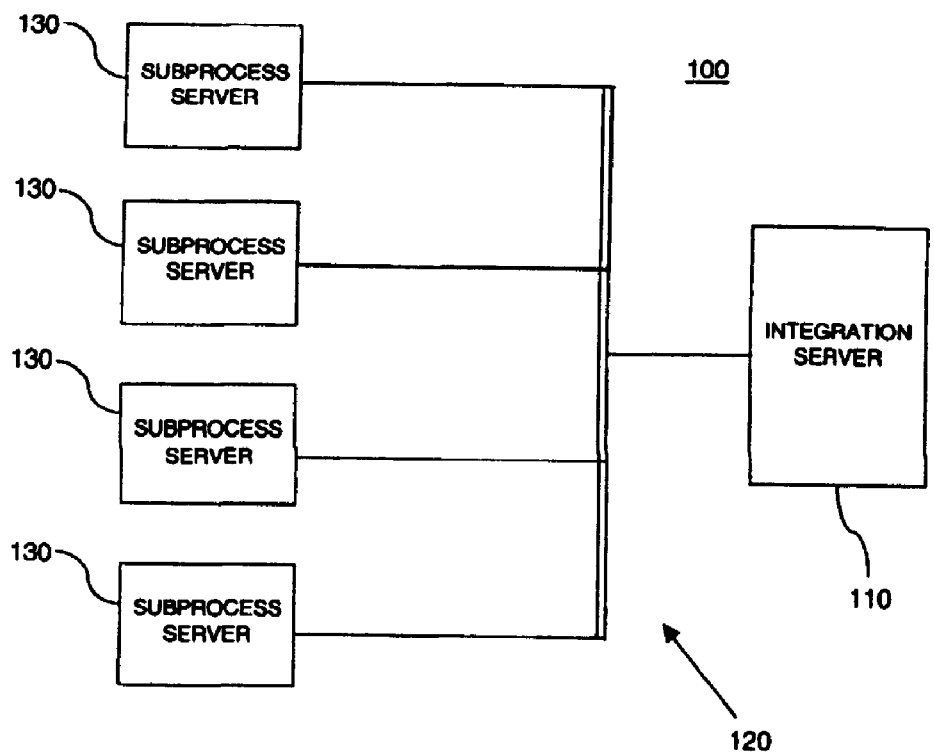
FIG. 1 is a block diagram illustrating an automated design integration system according to an embodiment of the invention.

The present invention involves the use of an automated design system to integrate multiple subprocesses having disparate data input and output formats into a single efficient overall process. FIG. 1 schematically illustrates an automated design integration system 100 that includes an integration server 110 and a plurality of subprocess servers 130. Each subprocess server 130 provides a different portion of the overall analysis with the various subprocess servers 130 requiring inputs from and supplying inputs to the other subprocess servers 130. The integration server 110 operates as an interface between the subprocess servers 130, manages the flow of data between the subprocess servers 130 and controls the optimization of the overall design process.

The subprocess servers 130 and the integration server 110 are interconnected through a communication network 120. It will be understood by those having ordinary skill in the art that any or all of these system components may be combined to form integrated units or may be separate units interconnected through the communication network 120. The communication network 120 may comprise any system for transmitting data between various locations, and may be, include or interface with any one or more of, for instance, the Internet, an intranet, a PAN (Personal Area Network), a LAN (Local Area Network), a WAN (Wide Area Network) or a MAN (Metropolitan Area Network), a storage area network (SAN), a frame relay connection, an Advanced Intelligent Network (AIN) connection, a synchronous optical network (SONET) connection, a digital T1, T3, E1 or E3 line, Digital Data Service (DDS) connection, DSL (Digital Subscriber Line) connection, an Ethernet connection, an ISDN (Integrated Services Digital Network) line, a dial-up port such as a V.90, V.34 or V.34bis analog modem connection, a cable modem, an ATM (Asynchronous Transfer Mode) connection, or an FDDI (Fiber Distributed Data Interface) or CDDI (Copper Distributed Data Interface) connection. The communication network 120 may furthermore be, include or interface to any one or more of a WAP (Wireless Application Protocol) link, a GPRS (General Packet Radio Service) link, a GSM (Global System for Mobile Communication) link, a CDMA (Code Division Multiple Access) or TDMA (Time Division Multiple Access) link such as a cellular phone channel, a GPS (Global Positioning System) link, CDPD (cellular digital packet data), a RIM (Research in Motion, Limited) duplex paging type device, a Bluetooth, BlueTeeth or WhiteTooth radio link, or an IEEE 802.11 (or Wi-Fi)-based radio frequency link. The communication network 120 may further be, include or interface to any one or more of an RS-232 serial connection, an IEEE-1394 (Firewire) connection, a Fibre Channel connection, an IrDA (infrared) port, a SCSI (Small Computer Systems Interface) connection, a USB (Universal Serial Bus) connection or other wired or wireless, digital or analog interface or connection.

The integration server 110 and the subprocess servers 130 may be or include for instance, a workstation running the Microsoft Windows™ NTTM, Windows™ 2000, Unix, Linux, Xenix, IBM AIX™, Hewlett-Packard UX™, Novell Netware™, Sun Microsystems Solaris™, OS/2™, BeOS™, Mach, Apache, OpenStep™ or other operating system or platform.

Some or all of the servers may communicate with other servers on the communication network 120 through a firewall. Firewalls are electronic security checkpoints that prevent the unwanted flow of damaging or otherwise undesirable information. The design and implementation of firewalls are generally known in the art.

Figure 2:
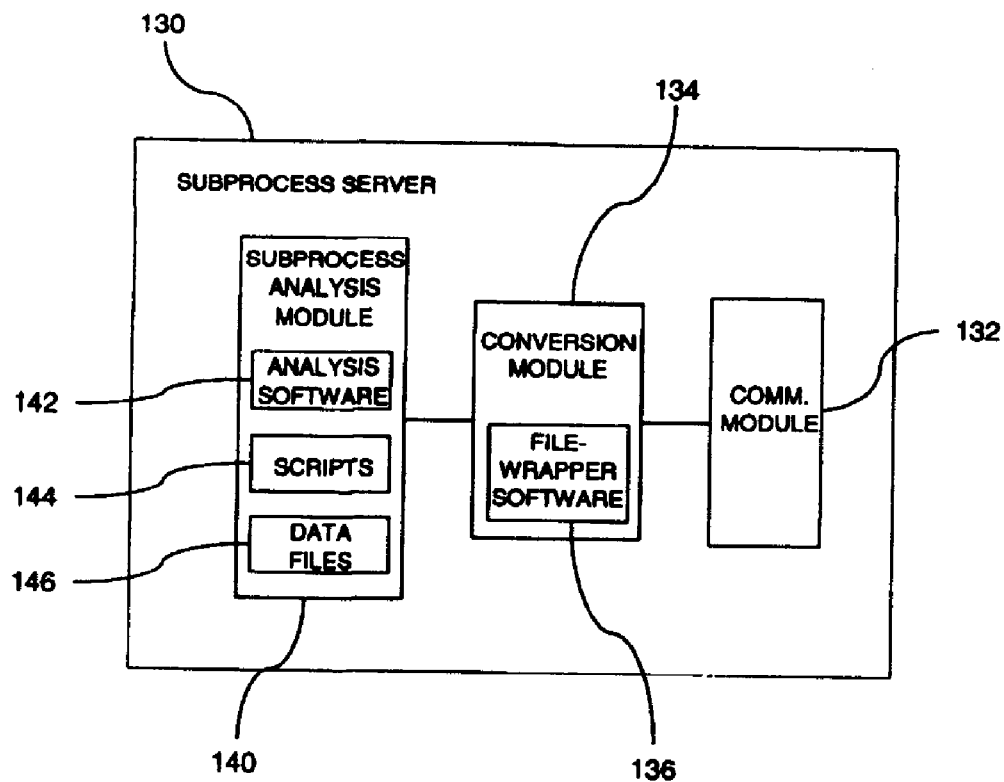
FIG. 2 is a block diagram illustrating a subprocess server that may be used in the automated design integration system of FIG. 1.

Any number of subprocess servers 130 may be used in the design integration system 100. A subprocess server 130 may include any data processor or system of data processors and may include a subprocess analysis module 140, a conversion module 134 and a communication module 132, as shown in FIG. 2. The subprocess analysis module 140 of each subprocess server 130 is configured to conduct a particular analysis that is required as part of the overall design process. The subprocess analysis module 140 has installed therein or has access to the analysis software 142, programming scripts 144 and data files 146 required to model a portion of the overall design. The analysis software 142 may be a commercially available individual software package or may be locally created software.

As previously noted, the analysis software 142, the model data files 146 or both may include proprietary information or processes. The present invention therefore provides for communication between the integration server 110 and the subprocess servers 130 that does not require that the analysis software of the integration server 110 interact directly with the analysis software 142 or data files 146 of the subprocess server 130. As will be discussed, the conversion module 134 acts as an overlay or translator to allow the integration server to communicate input data to the subprocess analysis module 140 and, if desired, to convert output data from the subprocess analysis module 140 to a predetermined format. The subprocess servers 130 may thus have subprocess analysis modules 140 with different platforms or different programming languages than the integration server 110 or that require that input data be provided to the analysis software 142 in a particular form that would not otherwise be provided by the integration server 110 or other subprocess analysis modules 140.

Input data required to conduct the analysis using the analysis module 140 are received from the integration server 110 by the communication module 132 of the subprocess server 130. The communication module 132 may include a connection to the network 120 or a direct connection to the integration server 110. The input data are passed from the communication module 132 to the conversion module 134. The communication module 132 may also be configured to receive output data from the conversion module 134 for transmission to the integration server 110.

The conversion module 134 includes filewrapper software 136 that assures that the input data is passed to the subprocess analysis module 140 in a usable format. The filewrapper software 136 also assures that the subprocess analysis module 140 returns the appropriate output data required for the overall analysis. It will be understood that, as used herein, the term format is intended to encompass all form and format characteristics that must be imparted to the input data in order for the data to be usable by the analysis module 140. The term format thus includes but is not limited to the manner and language of coding the data, measurement units used in the data and data entry format.

The filewrapper software 136 may include interpreting codes be configured to receive the input data from the integration server 110 in a particular predetermined format and convert it to a second predetermined format suitable for use by the subprocess analysis software 136. Alternatively, the filewrapper software 136 may be configured to recognize multiple data formats. In this variation, the filewrapper software 136 is able to identify a particular data format and convert the data from that format to the format required by the analysis software 136.

The filewrapper software 136 may also be configured to convert output data received from the analysis module 140 to a desired format for use by the integration server or another analysis module 140.

Figure 3:
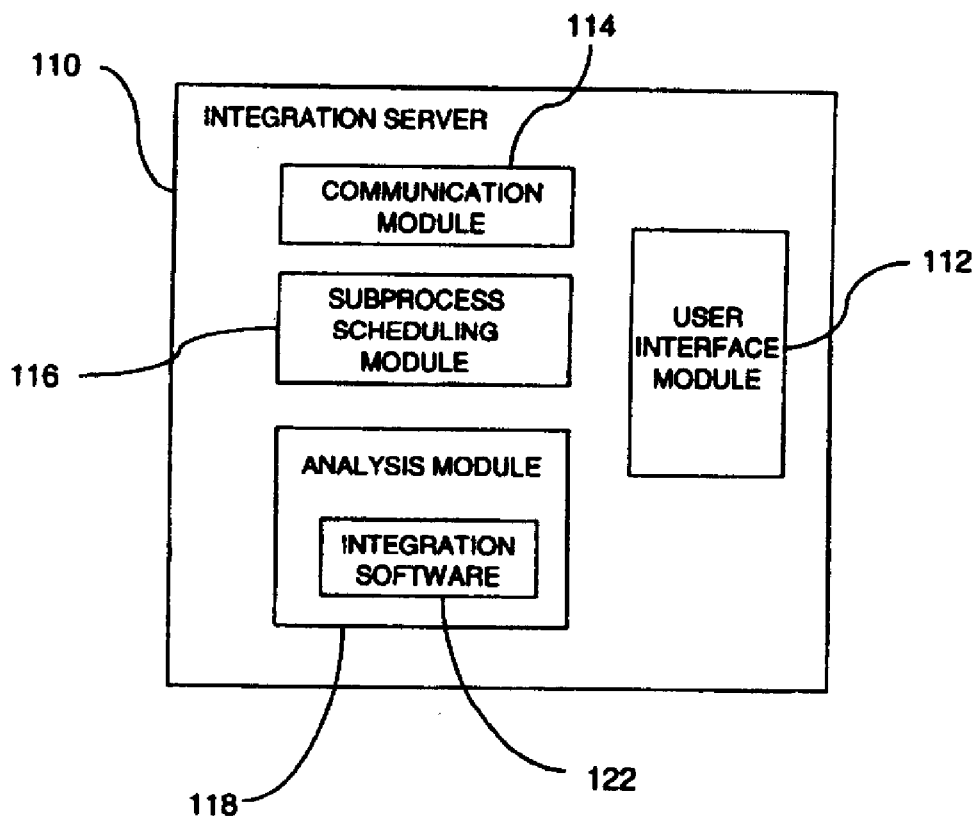
FIG. 3 is a block diagram illustrating an integration server that may be used in the automated design integration system of FIG. 1.

As shown in FIG. 3, the integration server 110 may include a user interface module 112, a communication module 114, a subprocess scheduling module 116 and an analysis module 118. The user interface module 112 may be any suitable arrangement for data entry such as a graphical user interface (GUI), keyboard, card reader and the like. The user interface module 112 is used to request a particular design analysis or optimization. It may also be used to enter design variables and values, analysis constraints and environmental factors significant to the analysis.

The communication module 114 is configured to transmit data to and receive data from the subprocess servers 130. The communication module 114 may include a connection to the network 120 and/or a direct connection to any of the subprocess servers 130. The flow of data to and from the integration server 110 is controlled by the subprocess scheduling module 116. The scheduling module 116 manages the flow of data between the analysis module 118 and the subprocess servers 130 and acts as an intermediary between the various subprocess servers 130. The scheduling module 116 is configured to determine the input requirements for each subprocess server 130 and arrange the order in which data is provided to the subprocess servers 130. This assures that output data from one subprocess server 140 is available when required as input by another subprocess server 140.

The scheduling module 116 is also configured to provide subprocess information to the integration analysis module 118 in a form that is readily usable by the integration software 122 stored therein. The integration software 122 may be configured to iteratively integrate information from all of the analysis subprocess servers 130 to obtain an optimized design solution. The integration software 122 may include commercially available integration software packages such as ANALYSIS SERVER® marketed by Phoenix Integration, Inc. and iSIGHT marketed by Engineous Software, Inc.

The design system 100 allows for the isolation of the analysis software and data of the various subprocess servers 130 from the integration software 122 of the integration server 110. The filewrapper software 136 for a particular subprocess server 130 may be generated by the subprocess owner or as a joint effort by the subprocess owner and the integration server owner or user. This allows for enhanced protection of any proprietary information in the subprocess server. Further protection may be achieved through the use of system security measures such as passwords, data encryption, and the like. It will be understood that the conversion module 134 and its associated filewrapper software 136 could be part of or co-located with the integration server 110 rather than being a part of the subprocess server 130. It will be further understood that a single conversion module could be configured for use in converting data for all of the subprocess servers.

It will also be understood that although the integration server 110 has been discussed as separate from the subprocess servers 130, the integration server 110 and one or more of the subprocess servers 140 may be integrated into a single server or processing system. Similarly, two or more of the subprocess servers 130 may be integrated into a single unit having multiple analysis modules 140.

In addition to the determination of new designs, the automated design system 100 may be used to conduct design analysis studies of existing designs wherein the majority of the modeled characteristics are fixed and certain characteristics of interest are variable. This allows the designer to examine the potential improvement resulting from specific design changes. In either case, the method of analysis typically involves the establishment of fixed design characteristics and the provision of a series of desired performance parameters. An initial set of variable characteristics is also established. The integration server 110 provides these data as necessary to the appropriate subprocess servers 130. The integration server 110 also receives output data from the subprocess servers 130 and returns it to other subprocess servers 130 as necessary. The scheduling module 116 controls the flow of data to and from the subprocess servers 130 so as to produce a set of performance results for the design characteristics analyzed. If the performance results do not meet the performance criteria within a predetermined range of acceptability, the variable characteristics of the design are adjusted and the analysis performed with the adjusted data.

While the above method describes a design optimization analysis, it will be understood that the design system 100 may be used in a non-iterative analysis as well.

Figure 4:
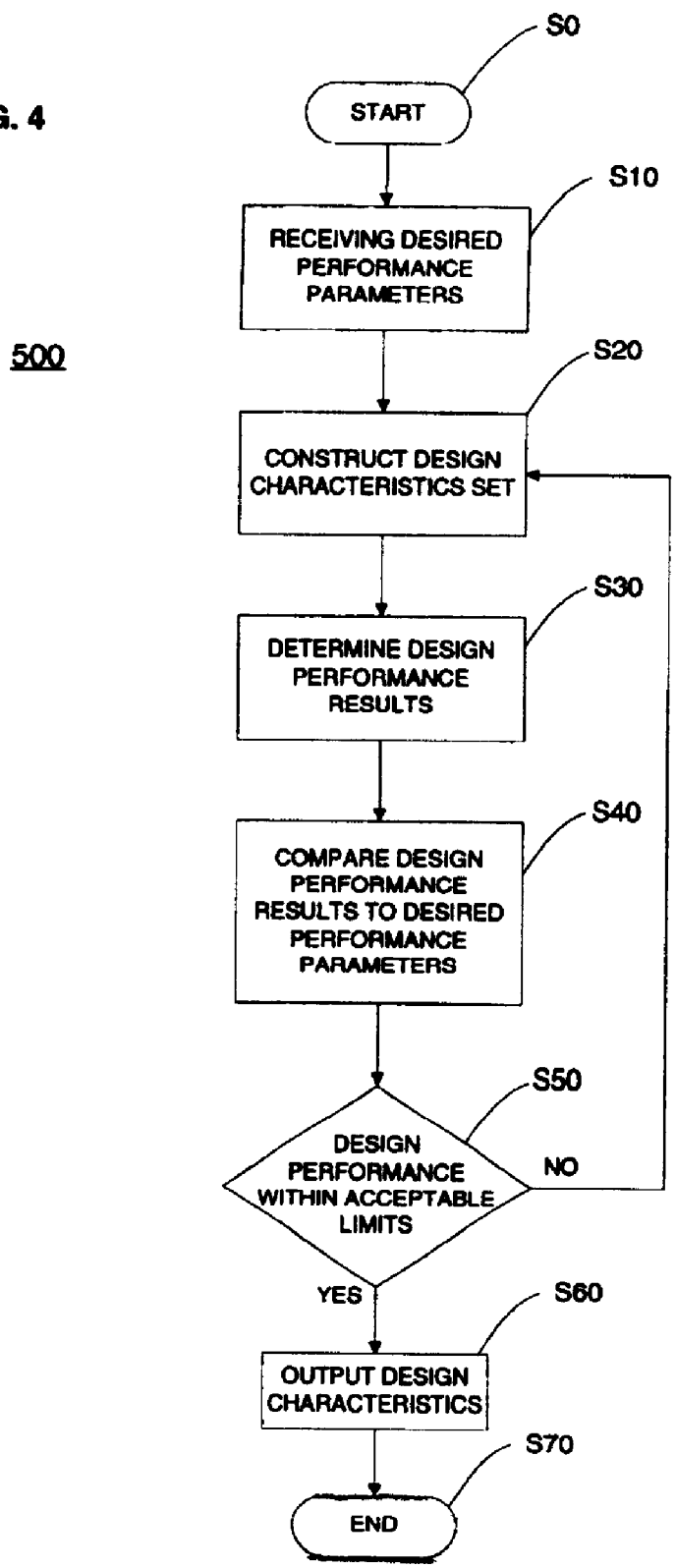
FIG. 4 is a flowchart illustrating steps performed in a design analysis method according to an embodiment of the invention.

FIG. 4 illustrates a design determination method 500. The method starts at step S0. At step S10, the design system 100 receives a set of desired performance parameters. Fixed design characteristics may also be received. At step S20, the integration server 110 constructs a set of design characteristics. At step S30, the design system 100 determines a set of design performance results using the analysis models of the subprocess servers 130. During this step, the scheduling module 116 manages the flow of data to and from the subprocess servers 130. As required, the conversion modules 134 of the subprocess servers 130 use the filewrapper software to convert input data received from the integration server 110 to a form usable by their respective subprocess analysis modules 140. The integration software 118 of the integration server 110 integrates the results of the subprocess analyses and formulates the set of design performance results for the design characteristics. At step S40 the design performance results are compared to the desired performance parameters. At step S50, a determination is made as to whether the design performance is within acceptable limits relative to the desired performance parameters. If the design performance is acceptable, the design characteristics are sent to an output device at step S60 and the method ends at step S70. If the performance is not acceptable, the method returns to step S20 where the design characteristics are adjusted. Steps S20 through S50 are repeated until the design performance is acceptable.

In carrying out step S30 of the above-described method, the integration server 110 schedules and manages the flow of data to the subprocess servers 130. When sending data to a particular subprocess server 130, the integration server will construct a set of analysis input information that includes the input data required for the subprocess server 130 to run its analysis. The input information provided by the integration server 110 may include design characteristics, performance requirements, output information from other subprocess servers or any other information required by the subprocess analysis module 140. The integration server 110 then communicates the input information to the subprocess server 130 through the communication module 114. The subprocess server 130 receives the input information through the subprocess server communication module 132. The input information is then processed by the conversion module 134 to assure that the input data required by the analysis software 142 are in the proper format. The subprocess analysis module 140 uses the input data to model the subprocess. The output of the analysis software 142 is then returned to the conversion module 134. The conversion module 134 may convert the output data to a particular format or, if desired, leave it in the format generated by the analysis software 142. The determination of whether to convert the output data may depend on how the output data is to be used. It may, for example, be more efficient to allow conversion to be accomplished by the conversion module of a subsequent subprocess server 130 that uses the output data. Alternatively, it may be desirable to convert the output data to a standard format required by the integration server 110 or another subprocess server 130.

The automated design process of this method is superior to manual iterative methods due to the ability to simultaneously iterate and satisfy the design constraints on many variables in various subprocess models.

Figure 5:
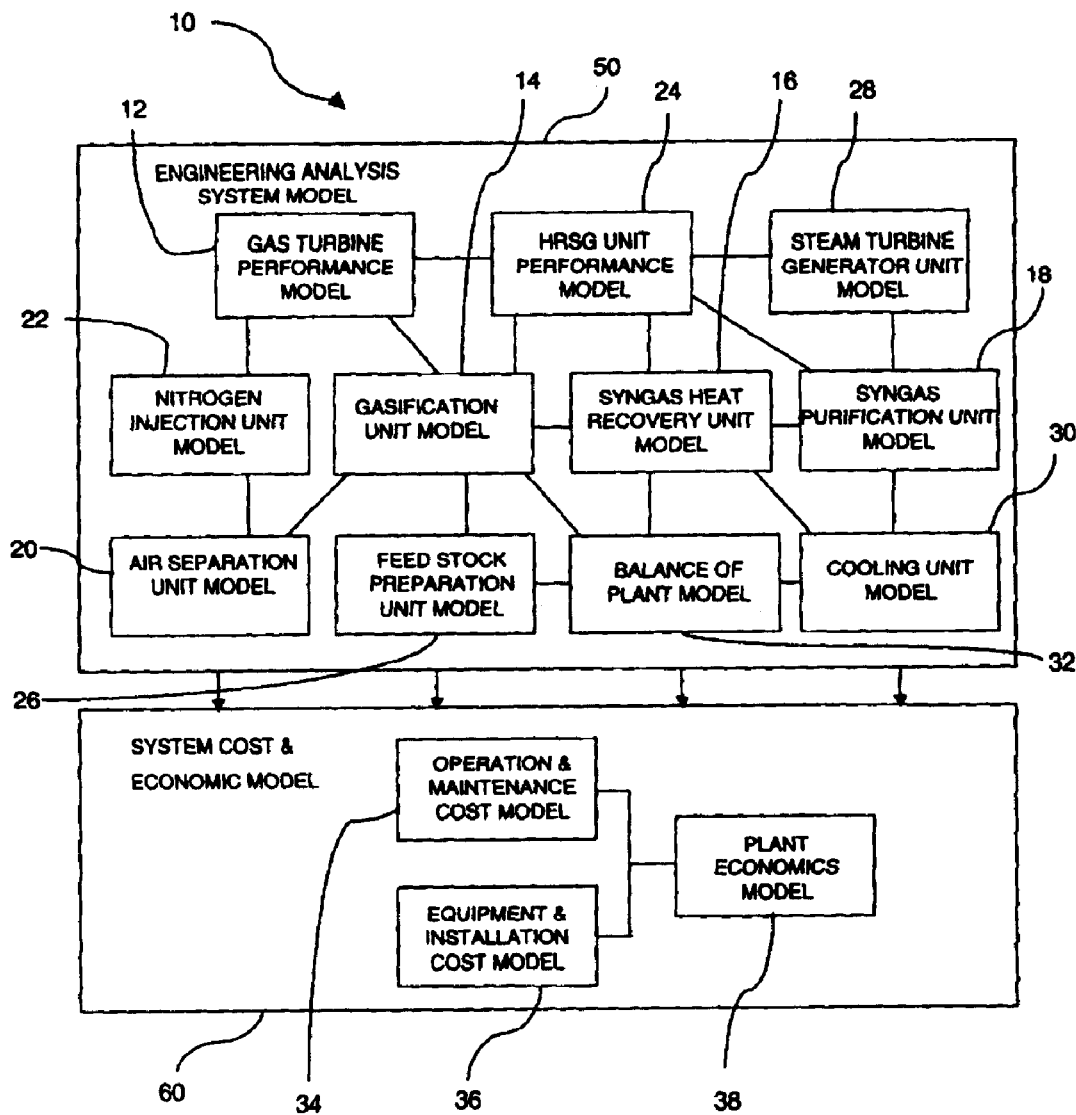
FIG. 5 is a block diagram of an IGCC power plant analysis model.

An exemplary use of the present invention is the automation of the analysis used to design or modify an IGCC power plant. FIG. 5 is a block diagram illustrating the overall modeling process and the various analysis models/subprocesses that may be used to design such a plant. As illustrated, each box represents a model/subprocess. A connection between two such subprocesses indicates that output data from one of the subprocesses are required as inputs to the other subprocess. The subprocesses are divided generally into engineering subprocesses (Engineering Analysis System Model 50) and economic subprocesses (System Cost and Economic Model 60). Cost information and cost-related constraints are passed between the economic subprocesses and each of the engineering subprocesses.

The following paragraphs describe the various components of an IGCC power plant model 10 and their associated analysis subprocesses as shown in FIG. 5.

Gas Turbine Unit Analysis

The Gas Turbine Unit consists of gas turbine generator components that utilize as fuel the clean syngas from the Syngas Purification Unit, provide extraction air to the Air Separation Unit and accept a nitrogen injection stream from the Nitrogen Injection Unit. The Gas Turbine Unit determines the size of the IGCC power plant and is the primary controller of the design, performance and economics of the plant. The Gas Turbine Performance Model 12 is a thermodynamics based model that evaluates the power output, heat rate, fuel consumption and other performance related data for the gas turbine. The performance model 12 calculates the exhaust gas outlet conditions of the gas turbine, which is needed for the analysis of downstream bottoming cycle units such as HRSG.

Gasification Unit Analysis

The Gasification Unit consists of sub-systems which convert the prepared hydrocarbon feed in the Feed Stock Preparation Unit, normally at high pressure, to a gaseous mixture including combustible constituents such as hydrogen, carbon monoxide, methane etc. This can be done by partial oxidation using an oxidant, usually air or oxygen. In some instances, the Gasification Unit may only use steam and a catalyst to breakdown the feed stock into gaseous fuels. The Gasification Unit model studies the state of flow and conversion of feedstock into a mixture of gases, called raw syngas. The process is exothermic and produces high temperatures, gaseous products, solid ash and un-burnt carbon particles. The raw syngas is cooled and treated in other IGCC units to make it suitable as a fuel for gas turbine combined cycle power plant units. The Gasification Unit Model 14 analyzes the chemical conversion and thermal performance and interfaces with other IGCC units.

Syngas Heat Recovery Unit Analysis

The Syngas Heat Recovery Unit consists of components which cool the raw syngas generated in the Gasification Unit and recover its energy, usually in the form of steam, hot water and/or cleaned fuel gases, etc. The Syngas Heat Recovery Unit Model 16 analyzes the flow and thermal energy transfer between the different hot and cold streams including raw and clean syngas, water and steam.

Syngas Purification Unit Analysis

The Syngas Purification Unit consists of components which clean and condition the raw syngas to make it suitable as a fuel gas in the Gas Turbine Unit and, in some cases, in the HRSG Unit. The unwanted gaseous products, such as sulfur compounds $H_2S$, COS, etc., are separated and converted to useful byproducts such as sulfur or sulfuric acid. The Syngas Purification Unit Model 18 analyzes the flow, thermal energy transfer and mass balance of various fluid streams passing through this unit.

Air Separation Unit Analysis

The Air Separation Unit is an optional unit in IGCC plants which use oxygen as the oxidant in the Gasification Unit. The Air Separation Unit separates compressed ambient air, which may be produced in an independent air compressor located within the unit, extracted from the gas turbine compressor or a combination of the two. For a cryogenic Air Separation Unit, the Air Separation Unit Model 20 analyzes the flow, mass balance and energy balance of air and its product streams and interacts with the Gasification Unit, Gas Turbine Performance and Nitrogen Injection Unit Models 14, 12, 22.

Nitrogen Injection Unit Analysis

In systems where a Nitrogen Injection Unit is included, the nitrogen stream from an Air Separation Unit is compressed and injected into the Gas Turbine Unit. In some instances, the Nitrogen Injection Unit includes sub-systems which recover thermal energy of the air extracted from the Gas Turbine Unit, add water/steam and supply heated and moisturized nitrogen to the gas turbine. The Nitrogen Injection Unit Model 22 analyzes the flow and thermal energy balance of its various fluid streams including gas turbine air extraction, HRSG Unit hot water and steam streams and the nitrogen stream from the Air Separation Unit.

Heat Recovery Steam Generator Analysis

The Heat Recovery Steam Generator (HRSG) unit consists of components which generate hot water and steam for generating electric power in the Steam Turbine Generator Unit. It also provides water and steam to other IGCC units for heat recovery and consumption. The HRSG Unit Performance Model 24 is a thermodynamic performance based model which calculates flow and thermal energy balances for all water and steam streams generated within the HRSG unit or that interfaced with the HRSG unit by various other units of the IGCC power plant.

Feed Stock Preparation Unit Analysis

The Feed Stock Preparation Unit sizes a single hydrocarbon feed or multiple feed mix, as needed, with additives, flux and moderator (usually water or steam) to make it suitable for processing in the Gasification Unit. Fuel Preparation Unit. The Feed Stock Preparation Unit Model 26 uses the state of flow and energy transfer between its sub-systems and the other units of the IGCC plant.

Steam Turbine Generator Unit Analysis

The Steam Turbine Generator Unit consists of components which generate electric power from the steam produced in the HRSG and Heat Recovery Units. It also provides extraction steam for deaeration of HRSG feed water and other uses within other sub-systems of IGCC. A steam condenser which cools the exhaust steam and returns water back to the HRSG is also included in this Unit. The Steam Turbine Generator Unit Model 28 is based on thermodynamics and calculates power generated and condenser cooling load based on input steam streams from HRSG and other units in the IGCC power plant.

Cooling Unit Analysis

The Cooling Unit consists of components which receive a cooling fluid stream, generally air or water, cool it and deliver it to various IGCC sub-systems requiring cooling. The Cooling Unit Model 30 calculates the cooling fluid flow rate, its consumption and the auxiliary power requirement.

Balance of Plant Unit Analysis

The Balance of Plant Unit consists of sub-systems which serve the auxiliary power, instrument air, make up water and auxiliary fuel requirements of various units in the IGCC power plant. The Balance of Plant Model 32 calculates the total auxiliary power, instrument air, make up water and auxiliary fuel requirements of various Units in the IGCC power plant.

Operation & Maintenance(O&M) Cost Model

The O&M Cost Model 34 calculates the required annual operating cost of running the IGCC power plant. The calculated O&M cost is used by the IGCC Power Plant Economic Model 38. The O&M Cost Model 34 calculates both fixed and variable operating costs based on site specific data on purchased items, credits for byproducts, operating plant personnel and temporary contract labor. The O&M Cost Model 34 includes the effect of expected operating duty (number of operating hours and number of starts per year), cost of replacing catalyst, chemicals and other consumable parts, cost of spare parts kept on site, maintenance/inspection intervals, and the IGCC power plant equipment scope.

Equipment & Installation Cost Model

The Equipment & Installation Costing Model 36 provides the turnkey cost of the IGCC power plant. Based on the equipment scope and labor rate of the location for the specified site, the turnkey cost is estimated based on equipment price regression analysis, or using data provided by the equipment manufacturers. The calculated turnkey cost is used for the IGCC Power Plant Economics Model 38.

Plant Economics Model

In order to evaluate the incremental benefit of new hardware or a feature added to an IGCC plant, a cost/performance benefit is performed. If the new hardware improves the performance of the power plant, the improvement must be sufficient to justify the added cost associated with the hardware. The IGCC Plant Economics Model 38 is used to evaluate the benefit of the new hardware or feature in terms of quantitative dollar amount. The Model 38 includes a cost of electricity model, a detailed financial return analysis, or an expected market price regression analysis. The Plant Economic Model 38 utilizes the power plant performance (output and heat rate), turnkey cost, annual O&M cost, fuel costs, capacity factor, and other economic assumptions.

Figure 6:
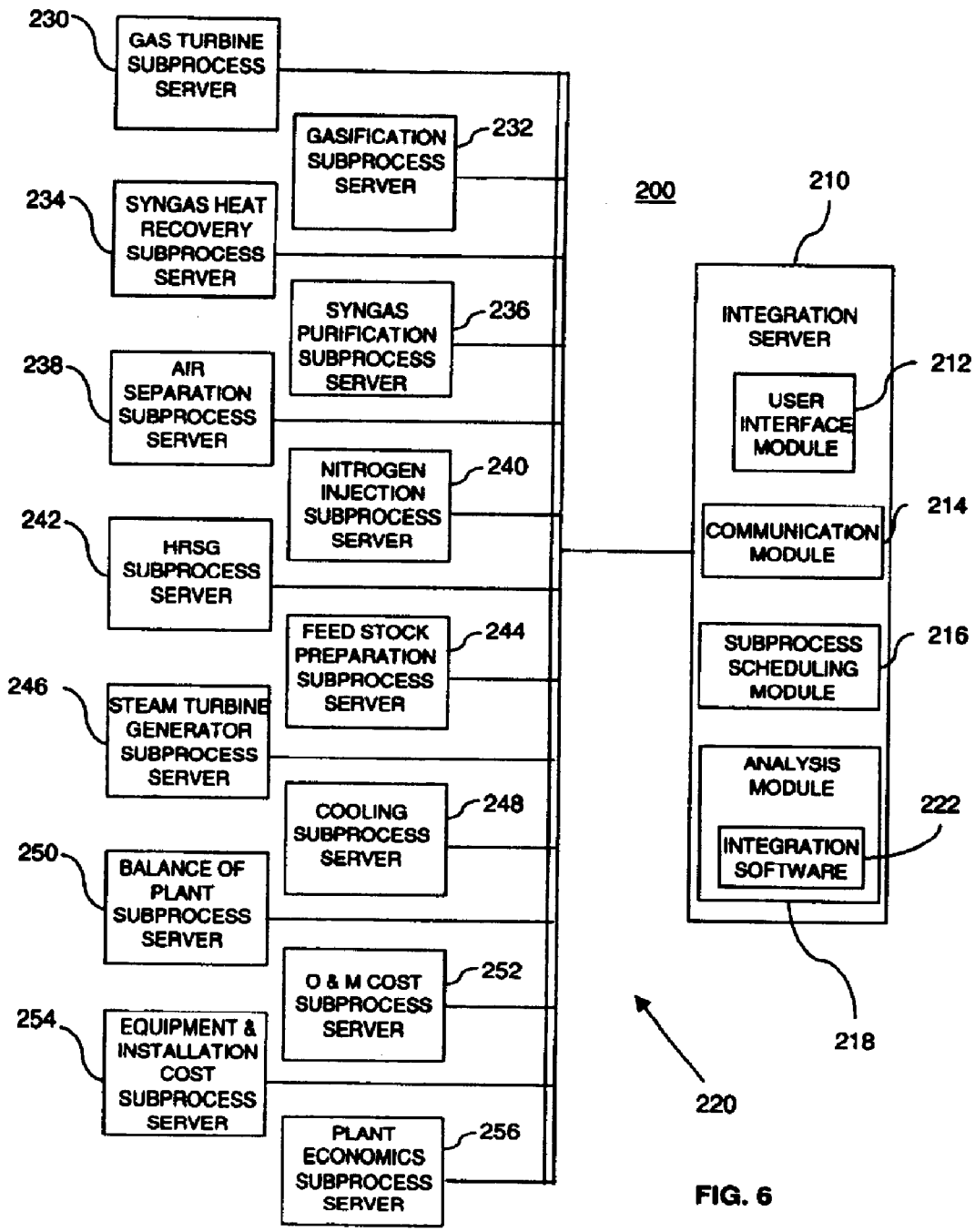
FIG. 6 is a block diagram illustrating an automated IGCC power plant design system according to an embodiment of the invention.
Figure 7:
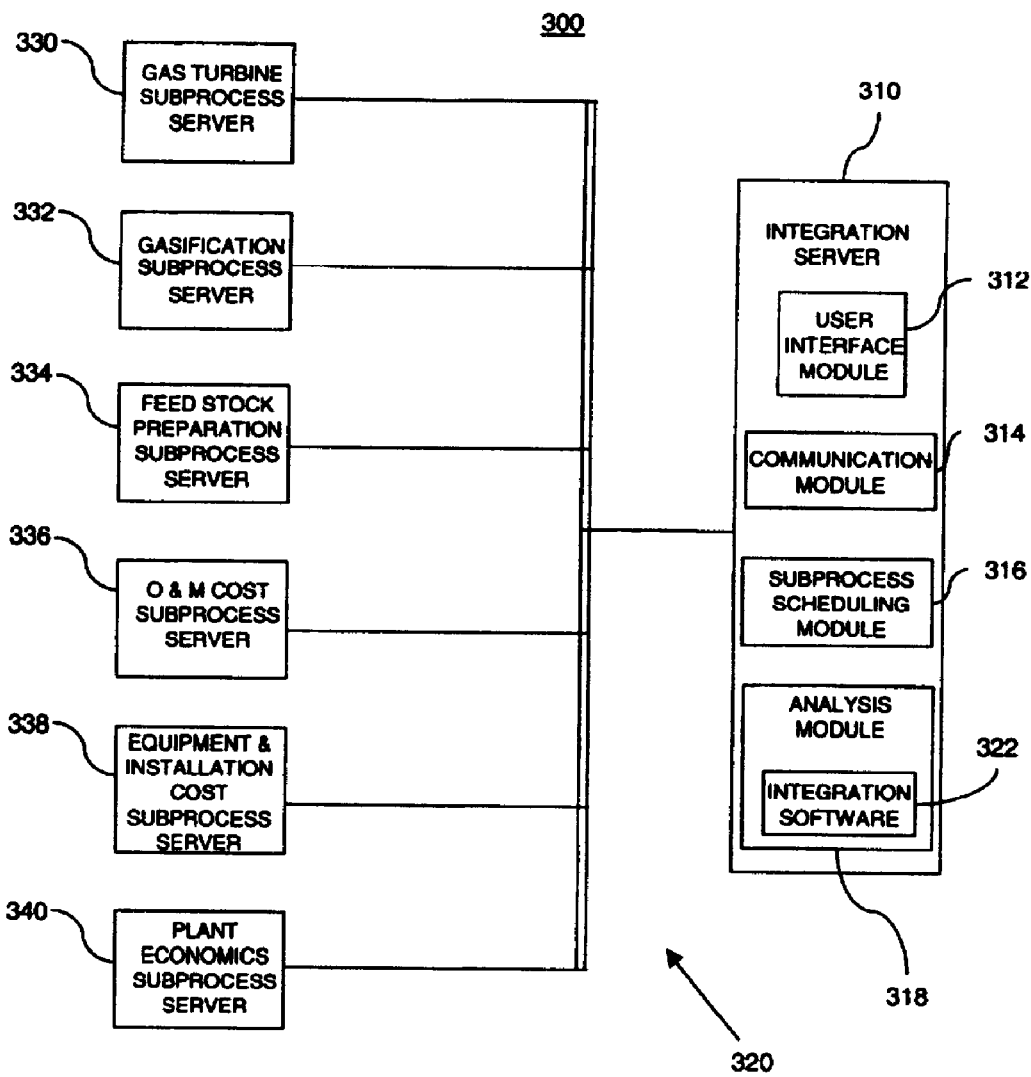
FIG. 7 is a block diagram illustrating an automated IGCC power plant design system according to another embodiment of the invention.

An automated IGCC power plant design system 200 incorporating a group of IGCC analysis models is illustrated schematically in FIG. 6. The system 200 includes a gas turbine subprocess server 230 incorporating a gas turbine performance model, a gasification subprocess server 232 incorporating a gasification unit model, a syngas heat recovery subprocess server 234 incorporating a syngas heat recovery model, a syngas purification subprocess server 236 incorporating a syngas purification unit model, an air separation subprocess server 238 incorporating a an air separation unit model, a nitrogen injection subprocess server 240 incorporating a nitrogen injection unit model, an HRSG subprocess server 242 incorporating an HRSG unit performance model, a feed stock preparation subprocess server 242 incorporating a feed stock preparation unit model, a steam generator subprocess server 246 incorporating a steam turbine generator unit model, a cooling subprocess server 248 incorporating a cooling unit model, a balance of plant subprocess server 250 incorporating a balance of plant model, an O&M cost subprocess server 252 incorporating an O&M cost model, an equipment and installation cost subprocess server 254 incorporating an equipment and installation cost model, and a plant economics subprocess server 256 incorporating a plant economics model. It will be understood that any two or more of the subprocess servers 230–256 may be integrated to form a single subprocess server configured to perform multiple subprocess analyses. In particular, it may be desirable to combine the cost-related servers into a single plant cost subprocess server.

The subprocess servers 230–256 are configured in a similar manner to the subprocess server 130 illustrated in FIG. 2 and are selectively connected to an integration server 210 through a network 220. Each of the subprocess servers includes an analysis module for implementing the appropriate subprocess model and a conversion module with file-wrapper software for converting input data to a format appropriate to the platform and language of the analysis module. The integration server 210 is operatively similar to the integration server 110 of FIG. 1 and includes a user interface module 212, a communication module 214, a subprocess scheduling module 216 and an analysis module 218.

While all of the above-described analysis subprocess models may be incorporated into the overall design analysis of an IGCC power plant, an exemplary design analysis using the present invention maybe conducted with a smaller set of subprocesses that model the essential components of the plant. Accordingly, an automated IGCC power plant design system 300 incorporating a smaller group of IGCC analysis models is illustrated schematically in FIG. 6. The system 300 includes a gas turbine subprocess server 330 incorporating a gas turbine performance model, a gasification subprocess server 332 incorporating a gasification unit model, a feed stock preparation subprocess server 334 incorporating a feed stock preparation unit model, an O&M cost subprocess server 336 incorporating an O&M cost model, an equipment and installation cost subprocess server 338 incorporating an equipment and installation cost model, and a plant economics subprocess server 340 incorporating a plant economics model. It will be understood that any two or more of the subprocess servers 330–340 may be integrated to form a single subprocess server configured to perform multiple subprocess analyses. In particular, it may be desirable to combine the cost-related servers into a single plant cost subprocess server.

The subprocess servers 330–340 are configured in a similar manner to the subprocess server 130 illustrated in FIG. 2 and are selectively connected to an integration server 310 through a network 320. Each of the subprocess servers includes an analysis module for implementing the appropriate subprocess model and a conversion module with file-wrapper software for converting input data to a format appropriate to the platform and language of the analysis module. The integration server 310 is operatively similar to the integration server 110 of FIG. 1 and includes a user interface module 312, a communication module 314, a subprocess scheduling module 316 and an analysis module 318.

It will be understood by those of ordinary skill in the art that the automated design system 300 could be used to model a less sophisticated power plant design with fewer components or could be used to provide a less precise analysis of a more complex power plant design such as that depicted schematically in FIG. 5.

Other embodiments and uses of the invention will be apparent to those skilled in the art from consideration of the specification and practice of the invention disclosed herein. The specification and examples should be considered exemplary only. The scope of the invention is limited only by the claims appended hereto.

What is claimed is:

1. An automated integrated gasification combined cycle IGCC power plant design integration system for determining an IGCC power plant design solution meeting a set of predetermined but variable design criteria, the system comprising:

a gas turbine subprocess server having a gas turbine subprocess analysis module and a gas turbine data conversion module adapted for receiving gas turbine input information from an integration server, converting the gas turbine input information to a predetermined gas turbine data input format and submitting the converted gas turbine input information to the gas turbine subprocess analysis module;

a gasification subprocess server having a gasification subprocess analysis module and a gasification data conversion module adapted for receiving gasification input information from an integration server, converting the gasification input information to a predetermined gasification data input format and submitting the converted gasification input information to the gasification subprocess analysis module;

a feed stock preparation subprocess server having a feed stock preparation subprocess analysis module and a feed stock preparation data conversion module adapted for receiving feed stock preparation input information from an integration server, converting the feed stock preparation input information to a predetermined feed stock preparation data input format and submitting the converted feed stock preparation input information to the feed stock preparation subprocess analysis module; and a plant cost subprocess server having at least one cost subprocess analysis module and at least one cost data conversion module adapted for receiving cost input information from the integration server, converting the cost input information to a predetermined cost data input format and submitting the converted cost input information to the cost subprocess analysis module; wherein the integration server is in selective communication with one or more of the gas turbine, gasification, feed stock preparation and plant cost subprocess servers, the integration server having a process analysis module adapted for processing output information received from and generating input information for delivery to the gas turbine, gasification, feed stock preparation and plant cost subprocess servers, the process analysis module being adapted to determine the IGCC power plant design solution based at least in part on the output information.

2. A system according to claim 1 wherein the integration server and at least one of the gas turbine, gasification, feed stock preparation and plant cost subprocess servers are selectively connected through a network.

3. An automated IGCC power plant design integration system for determining an integrated gasification combined cycle IGCC power plant design solution meeting a set of predetermined but variable design criteria, the system comprising:

a gas turbine subprocess server having a gas turbine subprocess analysis module;

a gas turbine data conversion module in communication with the gas turbine subprocess server and adapted for receiving gas turbine input information from an integration server, converting the gas turbine input information to a predetermined gas turbine data input format and submitting the converted gas turbine input information to the gas turbine subprocess analysis module;

a gasification subprocess server having a gasification subprocess analysis module;

a gasification data conversion module in communication with the gasification subprocess server and adapted for receiving gasification input information from an integration server, converting the gasification input information to a predetermined gasification data input format and submitting the converted gasification input information to the gasification subprocess analysis module;

a feed stock preparation subprocess server having a feed stock preparation subprocess analysis module;

a feed stock preparation data conversion module in communication with the feed stock preparation subprocess server and adapted for receiving feed stock preparation input information from an integration server, converting the feed stock preparation input information to a predetermined feed stock preparation data input format and submitting the converted feed stock preparation input information to the feed stock preparation subprocess analysis module;

a plant cost subprocess server having at least one cost subprocess analysis module;

at least one cost data conversion module in communication with the plant cost subprocess server and adapted for receiving cost input information from an integration server, converting the cost input information to a predetermined cost data input format and submitting the converted cost input information to the cost subprocess analysis module; and the integration server in selective communication with one or more of the gas turbine, gasification, feed stock preparation and cost data conversion modules, the integration server having a process analysis module adapted for processing output information received from and generating input information for delivery to the gas turbine, gasification, feed stock preparation and plant cost subprocess servers, the process analysis module being adapted to determine the IGCC power plant design solution based at least in part on the output information.

4. A system according to claim 3 wherein the integration server and the one or more of the gas turbine, gasification, feed stock preparation and plant cost data conversion modules are selectively connected through a network.

5. An automated IGCC power plant design integration system for determining an IGCC power plant design solution meeting a set of predetermined but variable design criteria, the system comprising:

a gas turbine subprocess server having a gas turbine subprocess analysis module;

a gasification subprocess server having a gasification subprocess analysis module;

a feed stock preparation subprocess server having a feed stock preparation subprocess analysis module;

a plant cost subprocess server having at least one cost subprocess analysis module;

an integration server in selective communication with the gas turbine, gasification, feed stock preparation and plant cost subprocess servers;

a process analysis module included in the integration server, the process analysis module being adapted for processing output information received from and generating input information for delivery to the gas turbine, gasification, feed stock preparation and plant cost subprocess servers, the process analysis module being further adapted to determine the IGCC power plant design solution based at least in part on the output information; and a data conversion module in communication with the integration server, the data conversion module being adapted for receiving gas turbine input information from the integration server, converting the gas turbine input information to a predetermined gas turbine data input format and submitting the converted gas turbine input information to the gas turbine subprocess analysis module, for receiving gasification input information from the integration server, converting the gasification input information to a predetermined gasification data input format and submitting the converted gasification input information to the gasification subprocess analysis module, for receiving feed stock preparation input information from the integration server, converting the feed stock preparation input information to a predetermined feed stock preparation data input format and submitting the converted feed stock preparation input information to the feed stock preparation subprocess analysis module, and for receiving cost input information from the integration server, converting the cost input information to a predetermined cost data input format and submitting the converted cost input information to the cost subprocess analysis module.

6. A system according to claim 5 wherein the integration server, the data conversion module and the gas turbine, gasification, feed stock preparation and plant cost data conversion modules are selectively connected through a network.

7. A system according to claim 5 wherein the data conversion module is a part of the integration server.

8. A system according to claim 5 wherein the data conversion module is a part of one of the gas turbine, gasification, feed stock preparation and plant cost subprocess servers.

* * * * *